(12) United States Patent
Jamneala et al.

(10) Patent No.: US 8,390,397 B2
(45) Date of Patent: Mar. 5, 2013

(54) BULK ACOUSTIC RESONATOR STRUCTURE COMPRISING HYBRID ELECTRODES

(75) Inventors: Tiberiu Jamneala, San Francisco, CA (US); Richard C. Ruby, Menlo Park, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 379 days.

(21) Appl. No.: 12/748,640

(22) Filed: Mar. 29, 2010

(65) Prior Publication Data

US 2011/0237204 A1    Sep. 29, 2011

(51) Int. Cl.
*H03H 9/70* (2006.01)
*H03H 9/54* (2006.01)

(52) U.S. Cl. ......... 333/133; 333/189; 310/322; 310/363

(58) Field of Classification Search .......... 333/189–192, 333/133; 310/322, 323, 326, 328, 334, 363
See application file for complete search history.

(56) References Cited

U.S. PATENT DOCUMENTS

| | | | |
|---|---|---|---|
| 5,587,620 A | 12/1996 | Ruby et al. | |
| 5,873,153 A | 2/1999 | Ruby et al. | |
| 6,107,721 A | 8/2000 | Lakin | |
| 6,262,637 B1 | 7/2001 | Bradley et al. | |
| 6,291,931 B1 * | 9/2001 | Lakin | 310/364 |
| 6,507,983 B1 | 1/2003 | Ruby et al. | |
| 6,515,558 B1 * | 2/2003 | Ylilammi | 333/189 |
| 6,828,713 B2 | 12/2004 | Bradley et al. | |
| 7,102,460 B2 * | 9/2006 | Schmidhammer et al. | 333/133 |
| 7,230,509 B2 * | 6/2007 | Stoemmer | 333/133 |
| 7,280,007 B2 | 10/2007 | Feng et al. | |
| 7,323,953 B2 * | 1/2008 | Yokoyama et al. | 333/187 |
| 7,355,324 B2 * | 4/2008 | Kim et al. | 310/320 |
| 7,388,454 B2 | 6/2008 | Ruby et al. | |
| 7,391,143 B2 * | 6/2008 | Bouche et al. | 310/327 |
| 7,391,286 B2 * | 6/2008 | Jamneala et al. | 333/189 |
| 7,424,772 B2 * | 9/2008 | Larson, III | 29/25.35 |
| 7,586,389 B2 * | 9/2009 | Ali-Ahmad et al. | 333/133 |
| 7,586,391 B2 | 9/2009 | Volatier et al. | |
| 7,612,488 B1 * | 11/2009 | Bouche et al. | 310/364 |

(Continued)

OTHER PUBLICATIONS

M.K. Small, et al. "A de-coupled stacked bulk acoustic resonator (DSBAR) filter with 2 dB bandwidth >4%", 2007 IEEE Ultrasonics Symposium, p. 604-607, Oct. 2007.

(Continued)

*Primary Examiner* — Barbara Summons

(57) ABSTRACT

In accordance with a representative embodiment, a BAW resonator structure, comprises a first BAW resonator, comprising: a first lower electrode having a first electrical resistance; a first upper electrode having a second electrical resistance; and a first piezoelectric layer disposed between the first lower electrode and the first upper electrode. The BAW resonator structure also comprises a second BAW resonator, comprising: a second lower electrode having the second electrical resistance; a second upper electrode having the first electrical resistance; and a second piezoelectric layer disposed between the second lower electrode and the second upper electrode. The BAW resonator structure also comprises an acoustic coupling layer disposed between the first BAW resonator and the second BAW resonator. The first electrical resistance is less than the second electrical resistance. An communication device comprising a coupled resonator filter (CRF) is also disclosed.

18 Claims, 5 Drawing Sheets

U.S. PATENT DOCUMENTS

| | | |
|---|---|---|
| 7,629,865 B2 | 12/2009 | Ruby |
| 8,198,958 B1 * | 6/2012 | Aigner et al. ............ 333/189 |
| 2004/0046622 A1 * | 3/2004 | Aigner et al. ............ 333/187 |
| 2005/0093396 A1 | 5/2005 | Larson, III et al. |
| 2007/0205850 A1 | 9/2007 | Jamneala et al. |
| 2008/0074005 A1 | 3/2008 | Sano et al. |
| 2009/0096549 A1 | 4/2009 | Thalhammer et al. |
| 2009/0102316 A1 | 4/2009 | Belot et al. |
| 2009/0256650 A1 | 10/2009 | Cathelin et al. |
| 2009/0273415 A1 | 11/2009 | Frank et al. |
| 2009/0302973 A1 | 12/2009 | Hart et al. |

OTHER PUBLICATIONS

T. Jamneala, et al. "Coupled resonator filter with single-layer acoustic coupler", IEEE Transaction on Ultrasonics, Ferroelectrics, and Frequency Control, p. 2320-2326, vol. 55, Oct. 2008.

C.M.M. Denisse, et al. "Plasma-enhanced growth and composition of silicon oxynitride films", J. Appl. Phys., Oct. 1, 1986, p. 2536-2542, vol. 60, No. 7.

J.E. Schoenholz, et al. "Plasma-enhanced deposition of silicon oxynitride films", Thin Solid Films, 148, 1987, p. 285-291.

* cited by examiner

BULK ACOUSTIC RESONATOR STRUCTURE COMPRISING HYBRID ELECTRODES

BACKGROUND

In many electronic applications, electrical resonators are used. For example, in many wireless communications devices, radio frequency (RF) and microwave frequency resonators are used as filters to improve reception and transmission of signals. Filters have traditionally included inductors and capacitors, and more recently include acoustic resonators.

As will be appreciated, it is desirable to reduce the size of many components of electronic devices. Certain known acoustic filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves can be converted into electrical waves for use in electrical applications.

One type of piezoelectric resonator is a Bulk Acoustic Wave (BAW) resonator. The BAW resonator includes an acoustic stack comprising, inter alia, a layer of piezoelectric material disposed between two electrodes. Acoustic waves achieve resonance across the acoustic stack, with the resonant frequency of the waves being determined by the materials of the layers of the acoustic stack, and the thicknesses of the layers of the acoustic stack. One particular type of BAW resonator comprises a thin film piezoelectric layer for the piezoelectric material. These resonators are often referred to as Film Bulk Acoustic Resonators (FBAR).

FBARs are similar in principle to bulk acoustic resonators such as quartz, but are scaled down in size to resonate at GHz frequencies. Because the FBARs have thicknesses on the order of micrometers (microns) and length and width dimensions of hundreds of microns, FBARs beneficially provide a comparatively compact alternative to certain known resonators.

FBARs may comprise an acoustic stack disposed over air. In such a structure, the acoustic stack is sometimes referred to as a membrane. Typically, the membrane is suspended over a cavity provided in a substrate. In other BAW resonator structures the acoustic stack is disposed over an acoustic mirror formed in the substrate. Regardless of whether the acoustic stack is suspended over air or provided over an acoustic mirror, the acoustic stack comprises a piezoelectric layer disposed over a first electrode, and a second electrode disposed over the piezoelectric layer.

Filters based on FBAR technology provide a comparatively low in-band insertion loss due to the comparatively high quality (Q) factor of FEAR resonators. FBAR-based filters are often employed in cellular or mobile telephones that can operate in multiple frequency bands. In such devices, it is important that a filter intended to pass one particular frequency band ("the passband") should have a high level of attenuation at other nearby frequency bands, which contain signals that are desirably rejected. Specifically, there may be one or more frequencies or frequency bands near the passband which contain signals at relatively high amplitudes that should be rejected by the filter. In such cases, it would be beneficial to be able to increase the filter's rejection characteristics at those particular frequencies or frequency bands, even if the rejection at other frequencies or frequency bands does not receive the same level of rejection.

One type of filter based on FBAR technology is known as a coupled resonator filter (CRF). A CRF comprises a coupling structure disposed between two vertically stacked FBARs. The CRF combines the acoustic action of the two FBARs, which leads to a bandpass filter transfer function. For a given acoustic stack, the CRF has two fundamental resonance modes, a symmetric mode and an asymmetric mode, of different frequencies. At any other frequency the CRF filter acoustic response is governed by a linear combination of the symmetric and asymmetric modes. The degree of difference in the frequencies of the modes depends, inter alia, on the degree or strength of the coupling between the two FBARs of the CRF. If the degree of coupling between the two FBARs is too great, the passband is unacceptably wide, and an unacceptable 'swag' or 'dip' in the center of the passband results. Moreover, if the degree of coupling between the two FBARs is too great, the insertion loss at the center of the passband is unacceptably high. Alternatively, if the degree of coupling is too weak for certain RF applications, the passband is unacceptably narrow.

The dependence of the passband on the degree of coupling has lead efforts to attempt to control the degree of coupling between the FBARs of the CRF. For many materials commonly used for acoustic applications at RF frequencies, the degree of coupling resulting from the interaction between the coupling material and the FBARs is too great, and results in an unacceptably high difference in the resonance frequencies of the modes of the CRF. Among other drawbacks, this results in an unacceptable 'dip' or 'swag' in the center of the passband, and unacceptable spreading of the passband.

One known technique used to control the degree of coupling between the FBARs of the CRF involves the use a coupling structure comprising a plurality of coupling layers with alternating high and low acoustic impedances. At each interface between each coupling layer a partial reflection of the acoustic mode occurs. The multiple interfaces provide a multiplicative reflective effect, and the degree of coupling between the FBARs can be beneficially controlled even when materials with relatively high acoustic impedances are employed in the coupling structure. While coupling structures comprising a plurality of coupling layers facilitate decoupling of the FBARs in the CRF, their presence adds complexity to the fabrication process, and ultimately to the cost of the resultant product.

What is needed, therefore, is a BAW resonator structure that overcomes at least the known shortcomings described above.

SUMMARY

In accordance with a representative embodiment, a BAW resonator structure comprises a first BAW resonator comprising: first lower electrode having a first electrical resistance; a first upper electrode having a second electrical resistance; and a first piezoelectric layer disposed between the first lower electrode and the first upper electrode. The BAW resonator also comprises a second BAW resonator comprising: a second lower electrode having the second electrical resistance; a second upper electrode having the first electrical resistance; and a second piezoelectric layer disposed between the second lower electrode and the second upper electrode. The BAW resonator structure also comprises an acoustic coupling layer disposed between the first BAW resonator and the second BAW resonator. The first electrical resistance is less than the second electrical resistance.

In accordance with another representative embodiment, a communication device comprises: a transmitter; a receiver; a transmit filter connected to the transmitter; and a receive filter connected to the receiver. The receive filter comprises a coupled resonator filter (CRF). The CRF comprises: a first BAW resonator comprising: a first lower electrode having a first electrical resistance; a first upper electrode having a second electrical resistance; and a first piezoelectric layer disposed between the first lower electrode and the first upper electrode. The CRF also comprises a second BAW resonator comprising: a second lower electrode having the second electrical resistance; a second upper electrode having the first electrical resistance; and a second piezoelectric layer disposed between the second lower electrode and the second upper electrode. The CRF also comprises an acoustic coupling layer disposed between the first BAW resonator and the second BAW resonator. The first electrical resistance is less than the second electrical resistance.

BRIEF DESCRIPTION OF THE DRAWINGS

The representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1A:
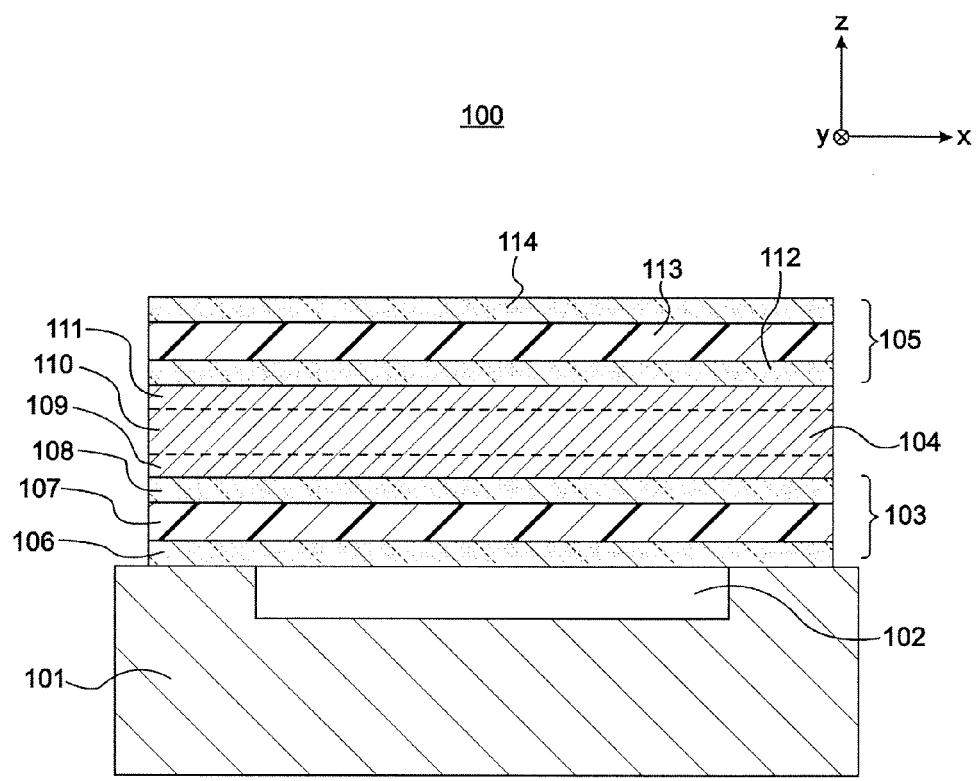
FIG. 1A is a cross-sectional view of a BAW resonator structure in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of representative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatus are within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as 'above' another element, for example, would now be 'below' that element.

The present teachings relate to BAW resonator structures (e.g., CRFs) comprising FBARs, their materials and their methods of fabrication. Certain details of the FBARs, materials thereof and their methods of fabrication may be found in one or more of the following U.S. Patents and Patent Applications: U.S. Pat. No. 6,107,721, to Lakin; U.S. Pat. Nos. 5,587,620, 5,873,153 and 6,507,983 to Ruby, et al.; U.S. Pat. No. 7,629,865, entitled "Piezoelectric Resonator Structures and Electrical Filters" to Richard C. Ruby; U.S. Pat. No. 7,280,007, entitled "Thin Film Bulk Acoustic Resonator with a Mass Loaded Perimeter" to Flongjun Feng, et at; and U.S. Patent Application Publication 20070205850, entitled "Piezoelectric Resonator Structures and Electrical Filters having Frame Elements" to Jameala, et al.; and U.S. Pat. No. 7,388,454, entitled "Acoustic Resonator Performance Enhancement Using Alternating Frame Structure" to Richard C. Ruby, et al. The disclosures of these patents and patent application publication are specifically incorporated herein by reference. It is emphasized that the components, materials and method of fabrication described in these patents and patent application publication are merely illustrative and other methods of fabrication and materials within the purview of one of ordinary skill in the art are contemplated.

FIG. 1A is a cross-sectional view of a BAW resonator structure 100 in accordance with a representative embodiment. In certain embodiments, the BAW resonator structure 100 may be configured through appropriate electrical connections to function as a CRF. More generally, the BAW resonator structure 100 may be configured to function as an acoustically coupled filter adapted for single-ended to differential signal transformation. Notably, many of the materials, their properties and thicknesses described in connection with representative embodiments below are selected for operating frequencies illustratively in the range of approximately 1.90 GHz to approximately 2.10 GHz. Selection of alternate materials to those described may require variation of the thicknesses of the materials from the illustrative thicknesses for operation of the BAW resonator structure 100 at the illustrative operational frequencies.

It is emphasized that the operational frequencies set forth above are merely illustrative, and operation at other frequencies are contemplated. More generally, the BAW resonator structure 100 is contemplated for use at operating frequencies of approximately 0.5 GHz to approximately 6.0 GHz, which is a typical frequency range of operation of common RF devices. Operation at other frequencies may require variation in the thicknesses of the layers of the BAW resonator structure 100 from the illustrative thicknesses for the illustrative materials disclosed in connection with representative embodiments. Moreover, operation at other frequencies may require selection of other materials for the BAW resonator structure 100 than those disclosed in connection with representative embodiment for other desired properties thereof. The present teachings contemplate the selection of such materials as would be within the purview of one of ordinary skill in the art having had the benefit of the present disclosure.

The BAW resonator structure 100 comprises a substrate 101 and a cavity 102 (often referred to as a 'swimming pool'). The BAW resonator structure 100 comprises a first BAW resonator 103 disposed over the cavity 102; and an acoustic coupling layer ("coupling layer") 104 disposed over the first BAW resonator 103. The BAW resonator structure 100 further comprises a second BAW resonator 105, which is disposed over the acoustic coupling layer 104. The first BAW resonator 103 comprises a first lower electrode 106, a first piezoelectric layer 107 and a first upper electrode 108. The second BAW resonator 105 comprises a second lower electrode 112, a second piezoelectric layer 113 and a second upper electrode 114 in sequence as shown. The BAW resonator structure 100 is fabricated by forming the first BAW resonator 103; forming the second BAW resonator 105; and forming the coupling layer 104 between the first BAW resonator 103 and the second BAW resonator 105. The fabrication of the first and second BAW resonators 103, 105, as well as the cavity 102 may be effected using known materials and processing methods, such as described in the incorporated patents and patent application publication above.

Generally, the material selected for the first lower electrode 106 and the second upper electrode 114 is the same; and the material selected for the first upper electrode 108 and the second lower electrode 112 is the same. Moreover, the material selected for the first lower electrode 106 and the second upper electrode 114 is different than the material selected for the first upper electrode 108 and the second lower electrode 112. Alternatively, the first lower electrode 106 and the second upper electrode 114 may be made of different materials; and the first upper electrode 108 and the second lower electrode 112 may be made of different materials. As such, the BAW resonator structure 100 comprises 'hybrid' electrodes comprising more than one material.

Illustratively, the first lower electrode 106 and the second upper electrode 114 each comprise one of: molybdenum (Mo), or aluminum (Al), or platinum (Pt), or beryllium (Be), or silver (Ag), or other material that provides desired electrical resistance for reasons described in greater detail below. The present teachings also contemplate the use of alloys of such materials. In addition, the material selected for the first lower electrode 106 and the second upper electrode 114 may have a lower acoustic impedance than the material selected for the first upper electrode 108 and the second lower electrode 112. In one embodiment, the first lower electrode 106 and the second upper electrode 114 each comprise molybdenum having a thickness of approximately 3000 Å. Notably, the layer of molybdenum of the second upper electrode may be slightly less than 3000 Å, so that a passivation layer (not shown), which typically comprises AlN, may be provided over the second upper electrode 114. In this case, the total thickness of the second upper electrode 114 and the passivation layer is approximately 3000 Å.

In a representative embodiment, the first piezoelectric layer 107 and the second piezoelectric layer 113 each comprise AlN and each have a thickness of approximately 12,500 Å. As should be appreciated by one of ordinary skill in the art, a seed layer (not shown) useful in the fabrication of the first and second piezoelectric layers 103, 113 may be provided. The use of such seed layers is known, and is described for example commonly-owned U.S. Pat. No. 6,828,713 to Bradley, et al. The disclosure of U.S. Pat. No. 6,828,713 is specifically incorporated herein by reference. The use of AlN for first and second piezoelectric layers 107, 113 is merely illustrative. Other piezoelectric materials suitable for thin film BAW resonator applications such as zinc oxide (ZnO), lead zirconium titanate (PZT), with thicknesses selected for the desired operational frequency range are contemplated.

In a representative embodiment, the acoustic coupling layer 104 comprises a single-material, and may comprise a single layer of the single material. In certain embodiments, the single-material has an inhomogeneous acoustic property across its thickness. Illustratively, the acoustic property is acoustic impedance. In other embodiments the single-material has a substantially homogeneous acoustic impedance across its thickness. In the embodiment depicted in FIG. 1, the acoustic coupling layer 104 comprises a first region 109, a second region 111, and a third region 110 between the first and second regions 109, 111. The respective acoustic impedances of the first, second and third regions 109~111 of the acoustic coupling layer are tailored to improve the passband characteristics of the CRF. It is emphasized that inclusion of three regions the acoustic coupling layer 104 is merely illustrative. More generally, in accordance with representative embodiments the acoustic coupling layer 104 comprising an inhomogeneous acoustic property across its thickness comprises two or more regions with differing selected acoustic properties. Further details of acoustic coupling layers having an inhomogeneous acoustic impedance across its thickness may be found in commonly-owned co-pending U.S. patent application Ser. No. 12/710,640 entitled "Bulk Acoustic Resonator Structures Comprising a Single Material Acoustic Coupling Layer Comprising Inhomogeneous Acoustic Property" to L. Elbrecht, et al., and filed on Feb. 23, 2010. This disclosure of U.S. patent application Ser. No. 12/710,640 is specifically incorporated herein by reference.

In a representative embodiment, the acoustic coupling layer 104 comprises carbon-doped silicon oxide (SiOC) having an acoustic impedance of approximately 3.0 MRayls to approximately 5.0 MRayls, and a thickness of approximately 3300 Å. Alternatively, the acoustic coupling layer 104 comprises one of silicon oxynitride ($SiO_xN_y$), or silicon low-k (SiLK)™ resin, or polyimide selected to provide a particular acoustic impedance and acceptable acoustic loss. Generally, the acoustic coupling layer 104 is selected to have a comparatively low acoustic impedance (illustratively in the range of approximately 1.0 MRayls to approximately 6.0 MRayls), and an acoustic loss of less than approximately 1000 dB/cm at 1 GHz. The selection of the properties of the acoustic coupling layer 104 must consider the overall acoustic loss and acoustic impedance of the selected material for the BAW resonator structure 100 and over the desired operational frequency range. For example, in a representative embodiment, SiOC having an acoustic impedance in the range of approximately 4.0 MRayls to approximately 5.0 MRayls provides a sufficiently low acoustic impedance and acceptable acoustic loss at the operational frequencies of interest. By contrast, SiOC having an acoustic impedance of approximately 2.0 MRayls provides greater acoustic decoupling of the first BAW resonator 103 and the second BAW resonator 105 across the entire filter passband, but results in unacceptably high acoustic losses at the operational frequencies of interest, and therefore, an unacceptable passband characteristic.

Details of an illustrative method of fabrication of a SiOC layer comprising an inhomogeneous acoustic property across its thickness are disclosed in commonly owned, co-pending U.S. patent application Ser. No. 12/710,590 filed on Feb. 23, 2010 and entitled "Acoustic Coupling Layer for Coupled Resonator Filters and Method of Fabricating Acoustic Coupling Layer" to Steven Gilbert, et al. The disclosure of U.S. patent application Ser. No. 12/710,590 is specifically incorporated herein by reference. The details of fabrication of a silicon oxynitride ($SiO_xN$) layer comprising an inhomogeneous acoustic property across its thickness are disclosed for example in "Plasma-Enhanced Growth and Composition of Silicon Oxynitride films," J. Appl. Phys. 60, p, 2536-2542, 1986 to C. M. M. Denisse; and "Plasma-Enhanced Deposition of Silicon Oxynitride Films," Thin Solid Films, 148, p. 285-291, 1987, to J. E. Schoenholtz and D. W. Hess. The disclosures of these references are specifically incorporated herein by reference.

In accordance with a representative embodiment, the first upper electrode 108 and the second lower electrode 112 each comprise a material selected to optimize a discontinuity of the acoustic impedance at the respective interfaces of the first upper electrode 108 and the second lower electrode 112, and the acoustic coupling layer 104. The optimization of the discontinuity of the acoustic impedance at the interface of the acoustic coupling layer 104 and the first upper electrode 108, and at the interface of the acoustic coupling layer 104 and the second lower electrode 112 improves the decoupling of the first BAW resonator 103 and the second BAW resonator 105, and thereby improves the passband characteristics of the BAW resonator structure 100. In an illustrative embodiment, the acoustic coupling layer 104 comprises SiOC having an acoustic impedance in the range of approximately 4.0 MRayls to approximately 5.0 MRayls, and the first upper electrode 108 and the second lower electrode 112 each comprise tungsten (W) having a thickness of approximately 2300 Å and an acoustic impedance of approximately 100 MRayls. It is emphasized that the selection of tungsten is merely illustrative, and that other materials are contemplated for the first upper electrode 108 and the second lower electrode 112. For example, the first upper electrode 108 and the second lower electrode 112 each may comprise one of ruthenium (Ru), or uranium ($U^{238}$), or osmium (Os). The present teachings also contemplate the use of alloys of such materials. Generally, the first upper electrode 108 and the second lower electrode 112 are made from the same material. Alternatively, the first upper electrode 108 and the second lower electrode 112 may be made of different materials. Furthermore, and as noted above, the thicknesses of the first upper electrode 108 and the second upper electrode 114 are determined based on the selected operational frequency of the BAW resonator structure 100.

More generally, materials for the acoustic coupling layer 104 and the first upper electrode 108 and the second lower electrode 112 are selected to provide a ratio of the acoustic impedance therebetween of approximately 4.5 to approximately 100, while providing an acceptable acoustic loss. The higher the discontinuity of the acoustic impedance of the acoustic coupling layer 104 to the first upper electrode 108, and to the second lower electrode 112, the greater is the decoupling of first BAW resonator 103 and the second BAW resonator 105. As noted above, this provides an acceptable passband width and acceptable passband 'dip' or 'swag.' By contrast, if the ratio of the acoustic impedance of the acoustic coupling layer 104 to the first upper electrode 108 and to the second lower electrode 112 is not sufficiently high, a poorly matched coupler would result in an unnecessarily wide passband with an unnecessarily large swag as described earlier.

By contrast to the illustrative use of tungsten for the first upper electrode 108 and the second lower electrode 112 in accordance with certain embodiments; the use of many other materials commonly used for electrodes in FBAR applications do not provide a suitable degree of discontinuity of the acoustic impedance at the respective interfaces of the first upper electrode 108 and the second lower electrode 112 and the acoustic coupling layer 104. For example, the use of aluminum (Al) or molybdenum (Mo), or other suitable material, which have a lower acoustic impedance than tungsten, for the first upper electrode 108 and the second lower electrode 112 and SiOC as the acoustic coupling layer 104 may not result in a suitable degree of acoustic impedance discontinuity between the acoustic coupling layer 104 and the first upper electrode 108, and between the acoustic coupling layer 104 and the second lower electrode 112. As such, the first BAW resonator 103 and the second BAW resonator 105 may not be suitably decoupled if the first upper electrode 108 and the second lower electrode 112 are comprised of aluminum, molybdenum, or other comparatively low acoustic impedance materials. As described above, comparatively poor decoupling between the first BAW resonator 103 and the second BAW resonator 105 may result in unacceptable passband characteristics for the BAW resonator structure 100.

While the degree of the impedance discontinuity between the acoustic coupling layer 104 and the first upper electrode 108, and the second lower electrode 112 significantly impacts the decoupling of the first BAW resonator 103 and the second BAW resonator 105, the first lower electrode 106 and the second upper electrode 114 have a lesser impact on the decoupling between the first BAW resonator 103 and the second BAW resonator 105 of the BAW resonator structure 100. As such, the acoustic impedance of the material selected for the first lower electrode 106 and the second upper electrode 114 does not need to be as great as the acoustic impedance of the material selected for the first upper electrode 108, and the second lower electrode 112. Rather, in accordance with representative embodiments, materials selected for the first lower electrode 106 and the second upper electrode 114 are selected to improve electrical losses in the BAW resonator structure 100. In particular, the first lower electrode 106 and the second upper electrode 114 each have an electrical resistance that is less than the electrical resistance of the first upper electrode 108 and the second lower electrode 112. The lower electrical resistance provided by the first lower electrode 106 and the second upper electrode 114 results in lower resistive losses in the BAW resonator structure 100 than if the first lower electrode 106 and the second upper electrode 114 were made of the same material as the first upper electrode 108 and the second lower electrode 112 (e.g., tungsten). The lower resistive losses result in improved insertion loss in the passband of the BAW resonator structure 100 configured as a CRF.

The illustrative selection of molybdenum or aluminum for the first lower electrode 106 and the second upper electrode 114 requires comparatively thick layers of the selected material required to meet operational frequency requirements due to the relatively high acoustic velocity and lower acoustic impedance of these materials compared to the materials (e.g. tungsten) used for the first upper electrode 108 and the second lower electrode 112. As such, to meet the operational frequency requirements for resonance for the BAW resonator structure 100, the first lower electrode 106 and the second upper electrode 114 each have a thickness of approximately 3000 Å, as noted above. The electrical resistance of the electrodes of the BAW resonator structure 100 structure is proportional to the electrical resistivity of the material selected for the electrode and inversely proportional to the thickness (where the thickness is along the z-direction in the coordinate system shown in FIG. 1A) of the electrode. In the representative embodiment, the material selected for the first lower electrode 106 and the second upper electrode 114 (e.g., molybdenum) has a greater electrical conductivity than the material selected for the first upper electrode 108 and the second lower electrode 112 (e.g., tungsten). Moreover, the selection of molybdenum (or aluminum) for the first lower electrode 106 and the second upper electrode 114 requires the thickness of these electrodes to be greater than the thickness of the first upper electrode 108 and the second lower electrode 112. As a result of the comparatively greater conductivity and the increased thickness of the material selected for the first lower electrode 106 and the second upper electrode 114, the first lower electrode 106 and the second upper electrode 114 each have a lower electrical resistance than the first upper electrode 108 and the second lower electrode 112. The lower electrical resistance of first lower electrode 106 and the second upper electrode 114 results in reduced the resistive losses compared to a BAW resonator structure in which these electrodes are tungsten or similar material. Beneficially, the reduced resistive losses result in an improved insertion loss of the passband of the BAW resonator structure 100.

By contrast to the illustrative use of aluminum or molybdenum for the first lower electrode 106 and the second upper electrode 114 in accordance with representative embodiments, the use of other materials commonly used for electrodes in FBAR applications would result in higher resistive losses, and greater insertion loss in the passband of the BAW resonator structure 100. For example, the use of tungsten for the first lower electrode 106 and the second upper electrode 114 requires comparatively thin (reduced thickness) electrodes. The reduced thickness in combination with the high resistivity of tungsten compared with molybdenum or aluminum will result in higher resistive losses in the BAW resonator structure 100, and greater insertion loss for the BAW resonator structure 100. As such, the use of hybrid electrodes (e.g., molybdenum for the first lower electrode 106 and the second upper electrode 114; and tungsten for the first upper electrode 108 and second lower electrode 112), beneficially provides suitable decoupling of the first BAW resonator 103 and the second BAW resonator 105 (i.e., desired passband characteristic), and reduced resistive losses (i.e., improved insertion loss across the passband).

While the use of materials with comparatively high acoustic impedance tungsten) for the first lower electrode 106 and the second upper electrode 114 may provide a marginally higher effective piezoelectric coupling coefficient (kr) of the BAW resonator structure 100 when compared to the use of materials for these electrodes with comparatively lower acoustic impedance (e.g., molybdenum), the use of materials with comparatively lower acoustic impedance for the first lower electrode 106 and second upper electrode 114 according to representative embodiments does not result in a significant degradation of the acoustic properties of each BAW resonator structure 100. As such, selection of a new optimum acoustic stack with an acceptable effective piezoelectric coupling coefficient is realized using materials described in connection with the representative embodiments.

Figure 1B:
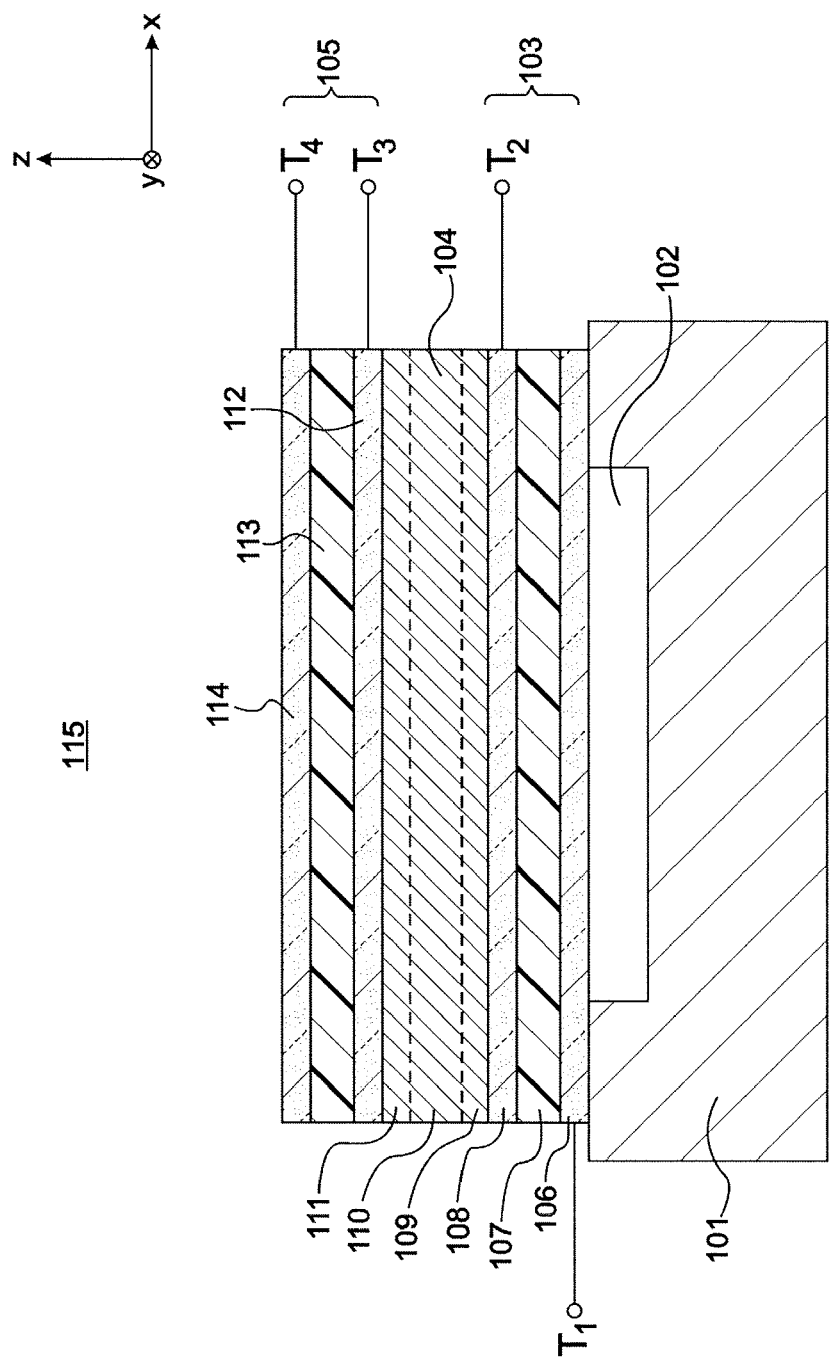
FIG. 1B is a cross-sectional view of a coupled resonator filter (CRF) in accordance with a representative embodiment.

FIG. 1B a cross-sectional view of a bulk acoustic wave coupled resonator filter (BWCRF) 115 (hereafter CRF 115) in accordance with a representative embodiment. Many features, materials and characteristics common to the BAW resonator structure 100. Such common features, materials and characteristics are not repeated to avoid obscuring the description of the representative embodiment.

The CRF 115 comprises a terminal $T_1$ connected to the first lower electrode 106, a terminal $T_2$ connected to the first upper electrode 108, a terminal $T_3$ connected to the second lower electrode 112, and a terminal $T_4$ connected to the second upper electrode. Appropriate connection of the terminals $T_1 \sim T_4$ allows for the configuration of a single-ended input to single-ended output CRF and for the configuration of a single-ended input to differential output CRF. For example, by connecting terminals $T_2$ and $T_3$ to each other and to ground, terminal $T_1$ functions as one port of the CRF 115 and terminal $T_2$ functions as another port of the CRF 115. In another example, by connecting terminal $T_2$ to ground, terminal $T_1$ functions as the port single-ended port and terminals $T_2$ and terminal $T_3$ function as respective differential ports.

In illustrative applications, CRF 115 may be used as a filter in duplex communications. One such application is described in connection with FIG. 4 below. Additionally, the present teachings contemplate filters comprising a half-ladder FBAR topology (i.e., a series FBAR and shunt FBAR), or a plurality of half-ladders, with the terminus half-ladder being connected to the CRF 115. As will be appreciated by one of ordinary skill in the art, additional stages selectively tuned provide nulls in the passband to effect the desired nearband rejection. Accordingly, multi-stage FBAR filter sections comprising CRF 115 are contemplated for use as the electrically coupled acoustic filters. It is emphasized that the FBAR topologies implemented to form such filters are intended merely to be illustrative. Further details of ladder filters may be found, for example, in commonly owned U.S. Pat. No. 6,262,637, entitled "Duplexer Incorporating thin-film bulk acoustic resonators (FBARs)" to Bradley, et al. The disclosure of this patent is specifically incorporated herein by reference. It is noted that this is merely illustrative, and it is emphasized that other configurations for other applications of the present teachings are contemplated by appropriate electrical connections.

Figure 2:
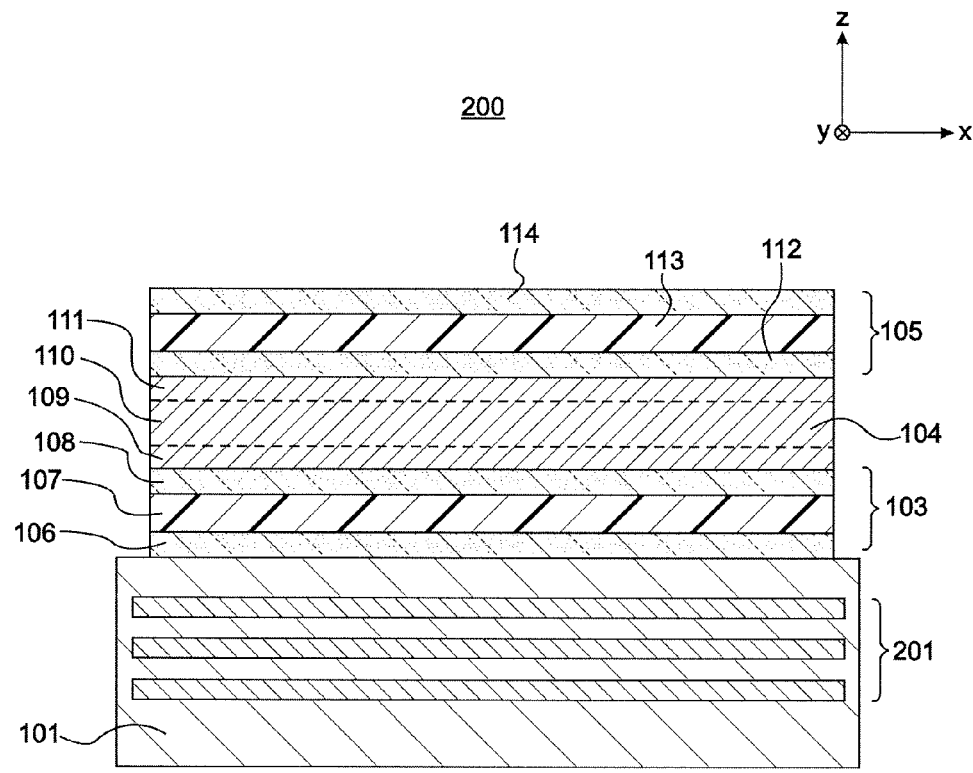
FIG. 2 is a cross-sectional view of a BAW resonator structure in accordance with a representative embodiment.

FIG. 2 is a cross-sectional view of a BAW resonator structure 200 in accordance with a representative embodiment. The BAW resonator structure 200 includes many features, materials and characteristics common to the BAW resonator structure 100. Such common features, materials and characteristics are not repeated to avoid obscuring the description of the representative embodiment. Moreover, the BAW resonator structure 200 may include terminals (not shown) configured to provide a CRF in the same manner as described in connection with FIG. 1B.

The BAW resonator structure 200 comprises an acoustic mirror 201 provided in the substrate 101. The acoustic mirror 201 provides acoustic isolation and is used instead of a cavity (e.g., cavity 102 shown in FIG. 1). In the representative embodiment, the BAW resonator structure 200 may be configured to function as a CRF through appropriate electrical connections (not shown in FIG. 2) such as described in connection with FIG. 1B. More generally, the BAW resonator structure 200 may be configured to function as an acoustically coupled filter adapted for single-ended to differential signal transformation.

Figure 3:
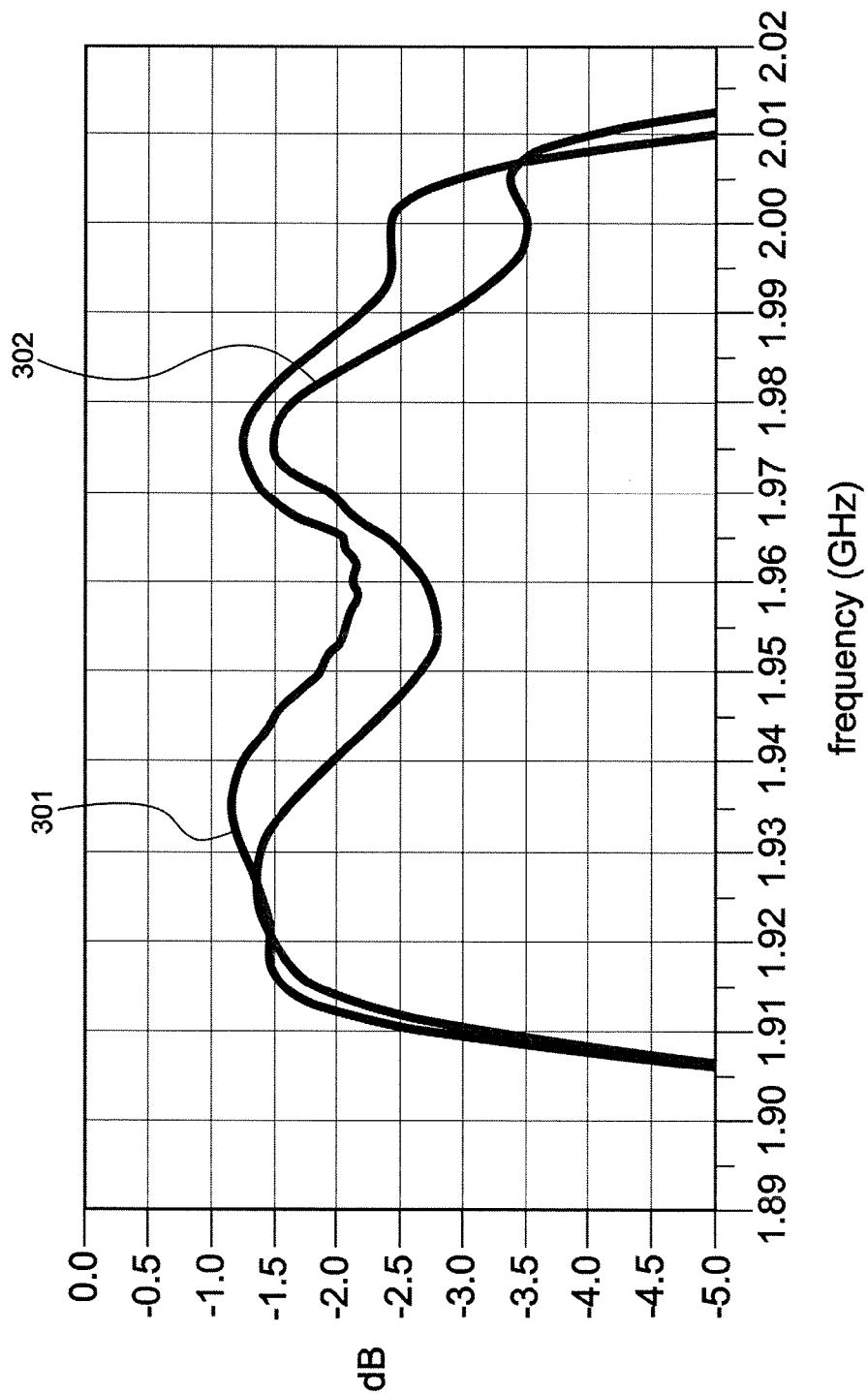
FIG. 3 is a graphical representation including a passband of a bulk acoustic wave coupled resonator filter (BWCRF) in accordance with a representative embodiment.

FIG. 3 is a graphical representation of a passband 301 of CRF 115 comprising hybrid electrodes in accordance with a representative embodiment. The CRF 115 is configured for single-ended input to single-ended output through the connection of terminals $T_1 \sim T_4$ outlined above in the description of FIG. 1B. Notably, the passband 301 represents the CRF 115 with hybrid electrodes according to a representative embodiment. Illustratively, the first lower electrode 106 and the second upper electrode 114 each comprise molybdenum, and each have a thickness of approximately 3000 Å; and the first upper electrode 108 and the second lower electrode 112 each comprise tungsten and each have a thickness of approximately 2300 Å. For purposes of comparison, a passband 302 of a known CRF having all electrodes (e.g., first lower electrode 106, first upper electrode 108, second lower electrode 112, second upper electrode 114) made of the same material is shown. Notably, the passband 302 represents the passband of BAW resonator structure in which the first lower electrode 106, the first upper electrode 108, the second lower electrode 112, and the second upper electrode 114 are made of tungsten.

From a review of FIG. 3 it is readily apparent that the passband 301 has substantially the same overall width as passband 302, but provides an improved insertion loss compared to passband 302. The insertion loss improvement of the passband 301 compared to the passband 302 is due to the reduced resistive losses resulting from the decreased electrical resistance of the first lower electrode 106 and the second upper electrode 114, which comprise molybdenum. The improved insertion loss of the passband 301 more than compensates for the comparatively small degradation in the piezoelectric coupling coefficient that results from the use of molybdenum for the first lower electrode 106 and the second upper electrode 114 discussed above.

Figure 4:
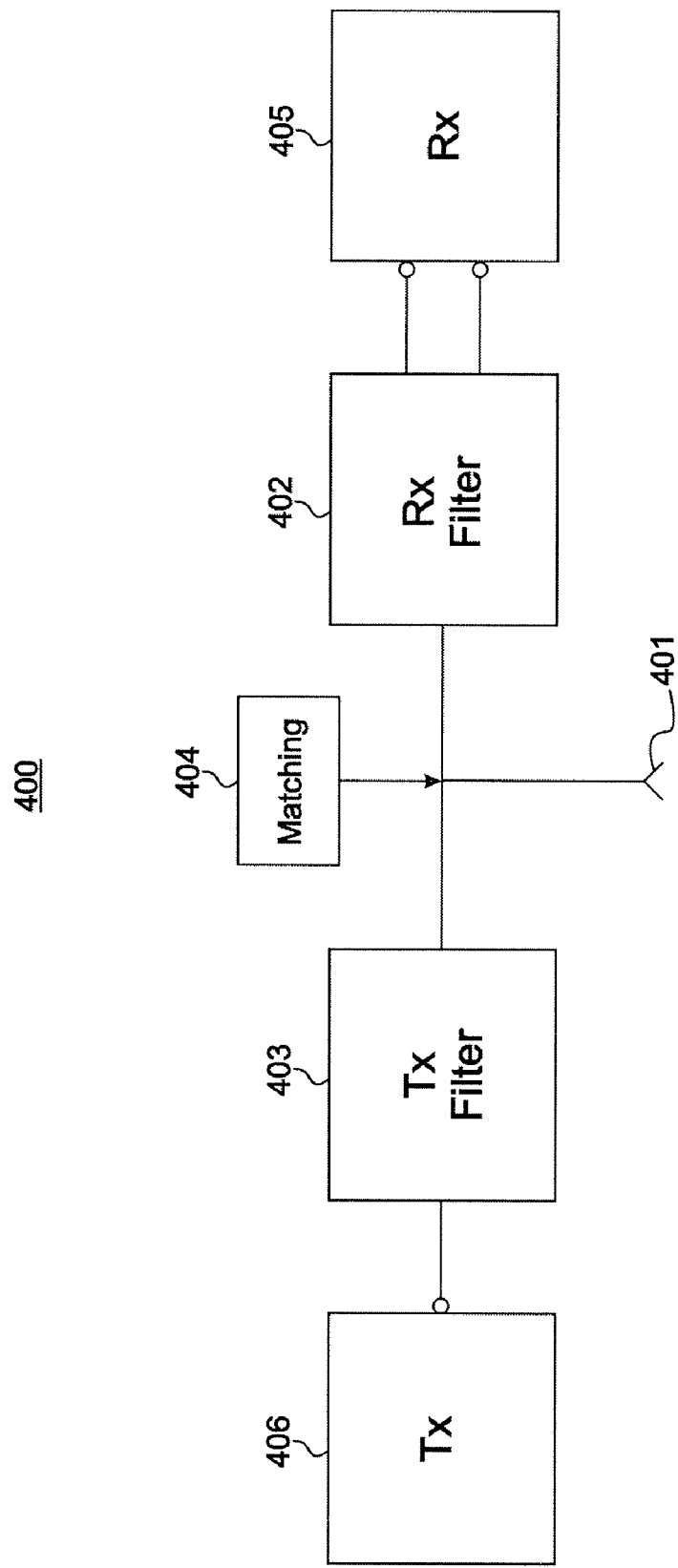
FIG. 4 is a simplified schematic diagram of a communication device in accordance with a representative embodiment.

FIG. 4 is a simplified schematic block diagram of a communication device 400 in accordance with a representative embodiment. The communication device 400 may be, for example, a cellular phone or similar device adapted for full duplex communication. The communication device 400 comprises an antenna 401, which is connected to a receiver (Rx) filter 402 and a transmitter (Tx) filter 403. An impedance matching network 404 is provided to facilitate the duplex function to and from the antenna 401. This impedance matching network 404 may be as described in commonly owned U.S. Application Patent Publication 2007/0176710 to Jamneala, et al., the disclosure of which is specifically incorporated herein by reference. Alternatively, other known matching techniques/networks may be used.

The transmitter filter 403 connects the antenna to a transmitter 405 and includes a single-ended Tx fitter having passband selected to correspond to the passband of the transmitter of the communication device 400. In a representative embodiment, the transmitter filter 403 comprises CRF 115 (not shown in FIG. 4) configured for single-ended input to single-ended output such as described in connection with FIG. 1B.

The receiver filter 402 connects the antenna 401 to the receiver 406 and comprises CRF 115 (not shown in FIG. 4). Illustratively, the CRF 115 is configured to provide a single-ended input to differential output transformation such as described in connection with FIG. 1B. As such, the CRF 115 of the receiver filter 402 provides the desired passband and nearband rejection desired for a single-ended input to a differential output 407 to the receiver 406.

In accordance with illustrative embodiments, BAW resonator structures comprising a hybrid electrode are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A BAW resonator structure, comprising:
a first BAW resonator comprising: a first lower electrode having a first electrical resistance; a first upper electrode having a second electrical resistance; and a first piezoelectric layer disposed between the first lower electrode and the first upper electrode, wherein the first electrical resistance is less than the second electrical resistance;
a second BAW resonator comprising: a second lower electrode having the second electrical resistance; a second upper electrode having the first electrical resistance; and a second piezoelectric layer disposed between the second lower electrode and the second upper electrode wherein the first lower electrode and the second upper electrode each have a first acoustic impedance, the first upper electrode and the second lower electrode have a second acoustic impedance, and the first acoustic impedance is less than the second acoustic impedance; and
an acoustic coupling layer disposed between the first BAW resonator and the second BAW resonator, wherein the acoustic coupling layer has a third acoustic impedance, which is less than the first acoustic impedance, and a ratio of the second impedance to the third impedance is approximately 4.0 to approximately 100.0.

2. A BAW resonator structure as claimed in claim 1, wherein first lower electrode and the second upper electrode each comprise one of: molybdenum (Mo), or aluminum (Al), or platinum (Pt), or beryllium (Be), or silver (Ag).

3. A BAW resonator structure as claimed in claim 1, wherein the first upper electrode and the second lower electrode each comprise one of: tungsten (W), or ruthenium (Ru), or uranium ($U^{238}$), or osmium (Os).

4. A BAW resonator structure as claimed in claim 1, wherein the acoustic coupling layer comprises a single material.

5. A BAW resonator structure as claimed in claim 1, wherein the acoustic coupling layer comprises carbon-doped silicon oxide (SiOC).

6. A BAW resonator structure as claimed in claim 1, wherein the acoustic coupling layer comprises a silicon low-k resin.

7. A BAW resonator structure as claimed in claim 1, wherein the acoustic coupling layer comprises silicon oxynitride ($SiO_xN$).

8. A BAW resonator structure as claimed in claim 1, wherein the BAW resonator structure comprises a coupled resonator filter (CRF).

9. A communication device, comprising:
a transmitter;
a receiver;
a transmit filter connected to the transmitter;
a receive filter connected to the receiver, the receive filter comprising a coupled resonator filter (CRF), the CRF comprising:
a first BAW resonator comprising: a first lower electrode having a first electrical resistance; a first upper electrode having a second electrical resistance; and a first piezoelectric layer disposed between the first lower electrode and the first upper electrode;
a second BAW resonator comprising: a second lower electrode having the second electrical resistance; a second upper electrode having the first electrical resistance; and a second piezoelectric layer disposed between the second lower electrode and the second upper electrode; and
an acoustic coupling layer comprising silicon oxynitride ($SiO_xN$) and disposed between the first BAW resonator and the second BAW resonator, wherein the first electrical resistance is less than the second electrical resistance.

10. A communication device as claimed in claim 9, wherein the first lower electrode and the second upper electrode each have a first acoustic impedance, the first upper electrode and the second lower electrode have a second acoustic impedance, and the first acoustic impedance is less than the second acoustic impedance.

11. A communication device as claimed in claim 10, wherein the acoustic coupling layer has a third acoustic impedance, which is less than the first acoustic impedance.

12. A communication device as claimed in claim 11, wherein the acoustic coupling layer comprises a single material.

13. A communication device as claimed in claim 9, wherein first lower electrode and the second upper electrode each comprise one of: molybdenum (Mo), or aluminum (Al), or platinum (Pt), or beryllium (Be), or silver (Ag).

14. A communication device as claimed in claim 9, wherein the first upper electrode and the second lower electrode each comprise one of: tungsten (W), or ruthenium (Ru), or uranium ($U^{238}$), or osmium (Os).

15. A communication device as claimed in claim 9, wherein the acoustic coupling layer comprises carbon-doped oxide (SiOC).

16. A communication device as claimed in claim 9, wherein the acoustic coupling layer comprises a silicon low-k resin.

17. A BAW resonator structure, comprising:
a first BAW resonator comprising: a first lower electrode having a first electrical resistance; a first upper electrode having a second electrical resistance; and a first piezoelectric layer disposed between the first lower electrode and the first upper electrode;
a second BAW resonator comprising: a second lower electrode having the second electrical resistance; a second upper electrode having the first electrical resistance; and a second piezoelectric layer disposed between the second lower electrode and the second upper electrode, wherein the first electrical resistance is less than the second electrical resistance; and
a single layer of a single acoustic coupling material disposed between the first BAW resonator and the second BAW resonator, the single layer of the single material acoustic coupling layer having an inhomogeneous acoustic property across its thickness.

18. A BAW resonator structure as claimed in claim 17, wherein the inhomogeneous acoustic property is acoustic impedance.

* * * * *